(12) United States Patent
Lou

(10) Patent No.: US 7,522,070 B2
(45) Date of Patent: *Apr. 21, 2009

(54) METHOD AND APPARATUS FOR HIGH PERFORMANCE KEY DETECTION WITH KEY DEBOUNCE

(75) Inventor: Wenkwei Lou, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/803,735

(22) Filed: May 15, 2007

(65) Prior Publication Data

US 2007/0216543 A1   Sep. 20, 2007

Related U.S. Application Data

(63) Continuation of application No. 11/087,524, filed on Mar. 23, 2005, now Pat. No. 7,230,548.

(60) Provisional application No. 60/613,658, filed on Sep. 28, 2004.

(51) Int. Cl.
  *H03K 17/94* (2006.01)

(52) U.S. Cl. .......................................... 341/22; 341/26
(58) Field of Classification Search ................... 341/22, 341/26
  See application file for complete search history.

(56) References Cited

U.S. PATENT DOCUMENTS

| 3,973,256 A | 8/1976 | Stoesser et al. |
| 4,022,098 A | 5/1977 | Deutsch et al. |
| 4,621,319 A | 11/1986 | Braun et al. |
| 7,230,548 B2 * | 6/2007 | Lou ............................ 341/26 |
| 2006/0068771 A1 | 3/2006 | Lou |

* cited by examiner

*Primary Examiner*—Timothy Edwards, Jr.

(57) ABSTRACT

A system for detecting a key with key debounce including a circuit for detecting a key activation; a first counter coupled to the circuit and a clock for testing the key activation for a first predetermined number of clock cycles; a key debounce buffer for storing a key index identifying the activated key, if the key activation is valid for the first predetermined number of clock cycles; a second counter for testing the identified activated key for a first predetermined number of hardware key scan cycles; and a key event buffer for storing a key activation event, if the key activation is valid for the first predetermined number of hardware key scan cycles.

20 Claims, 8 Drawing Sheets

| UP/DN | Key Index | CNTR UP/DN |
|---|---|---|
| 1/0 | "A" | 2/3 |
| | | |
| | | |
| | | |
| | | |
| | | |
| ⋮ | ⋮ | ⋮ |

FIG. 7

| UP/DN | |
|---|---|
| 0 | "A" |
| 1 | "A" |
| | |
| | |
| ⋮ | ⋮ |

FIG. 8

METHOD AND APPARATUS FOR HIGH PERFORMANCE KEY DETECTION WITH KEY DEBOUNCE

CROSS-REFERENCE TO RELATED APPLICATIONS

This is a Continuation of patent application Ser. No. 11/087,524 filed Mar. 23, 2005, now U.S. Pat. No. 7,230,548, and entitled "METHOD AND APPARATUS FOR HIGH PERFORMANCE KEY DETECTION WITH KEY DEBOUNCE," which claims the benefit of the filing date of U.S. Provisional Patent Application Ser. No. 60/613,658, filed on Sep. 28, 2004, and entitled "METHOD AND APPARATUS FOR HIGH PERFORMANCE KEY DEBOUNCE," the entire content of which is hereby expressly incorporated by reference.

BACKGROUND

This disclosure relates generally to electronic circuits; and more particularly to a high performance key debounce correction method and circuit.

User input devices that include mechanical keys typically suffer from errors generated by key debounces. Key debounces are typically caused by mechanical bounces of the keys that generate glitches in the key signals. This, in turn, may lead to an incorrect detection of the key. For example, a key that is only pressed once may generate key debounce that may lead a keyboard controller to believe that the same key was pressed twice. Alternatively, the key debounce may cause the keyboard controller to believe that the key was not pressed at all.

A key debounce correction circuit inhibits an unintended double entry (or lack of entry) of a pressed key in a keyboard that may occur if the pressed key bounces when activated. However, typical key debounce systems are implemented in firmware and are dependent on the instruction cycles of a processor. These systems are relatively slow and may take up some of the processor execution time. Additionally, since the conventional systems are dependent on instruction cycles of the processor, their timing may not be uniform and predictable.

Therefore, there is a need for a hardware-based high performance key debounce correction method and circuit.

SUMMARY

This disclosure is related to a high performance key debounce correction method and circuit.

In a general aspect, a method includes detecting a key activation of a user operated input device, testing the key activation for a predetermined number of clock cycles, storing a key index identifying the activated key in a buffer when the key activation is valid for the predetermined number of clock cycles, testing the identified activated key for a predetermined number of hardware key scan cycles, and establishing a key activation event when the key activation is valid for the predetermined number of hardware key scan cycles.

In another general aspect, a system for detecting a key with key debounce includes a circuit configured to detect a key activation, a first counter coupled to the circuit and a clock configured to test the key activation for a first predetermined number of clock cycles, a key debounce buffer configured to store a key index identifying the activated key when the key activation is valid for the first predetermined number of clock cycles, a second counter configured to test the identified activated key for a first predetermined number of hardware key scan cycles, and a key event buffer configured to store a key activation event when the key activation is valid for the first predetermined number of hardware key scan cycles.

In another general aspect, a system includes a keyboard for receiving input from a user, a first counter coupled to the circuit and a clock configured to test an activation of a key in the keyboard for a predetermined number of clock cycles, a key debounce buffer configured to store a key index identifying the activated key when the key activation is valid for the first predetermined number of clock cycles, a second counter configured to test the tested activated key for a predetermined number of hardware key scan cycles when the activation of the key is valid for the predetermined number of clock cycles, a key event buffer configured to store a key activation event when the key activation is valid for the first predetermined number of hardware key scan cycles, and an antenna configured to transmit a signal to a host indicating a key activation when the key activation is valid for the first predetermined number of hardware key scan cycles.

BRIEF DESCRIPTION OF THE DRAWINGS

FIG. 7 is an exemplary debounce buffer, according to one embodiment; and

FIG. 8 is an exemplary key event buffer, according to one embodiment.

DETAILED DESCRIPTION

In one embodiment, a method and apparatus for a hardware-implemented switch debounce circuit for correcting mechanical bounces of the keys are disclosed. The debounce circuit provides power/performance efficient design that is even more suitable for wireless input devices. In one embodiment, the key debounce is divided into two operations: micro-debounce and macro-debounce. The micro-debounce is a preliminary filtering mechanism for the key press (down) event. This operation filters out short term event(s) that may occur during the key press. Once a key activation is detected, the key activation is tested again in the next few cycles based on a value defined in a register. Once the micro-debounce criterion is met, the status of the key is moved into a key buffer for macro-debounce operation. The macro-debounce checks that the key is meeting debounce requirement in (user-definable) multiple hardware key scan cycles.

Although this description uses a keyboard and a mouse as examples for an input device, the described embodiments below are not limited to keyboards and mice. Other input devices such as headsets, game controllers, microphones, sensors, etc. that include mechanical keys are also possible. In that context, the term "key" is used generically for a user activated input. For example, in the case of a mouse or a game controller, a key activation could be the movement of the mouse or a joystick. In the case of a headset, a microphone, or a sensor the key activation could be voice or a sensed event.

Figure 1:
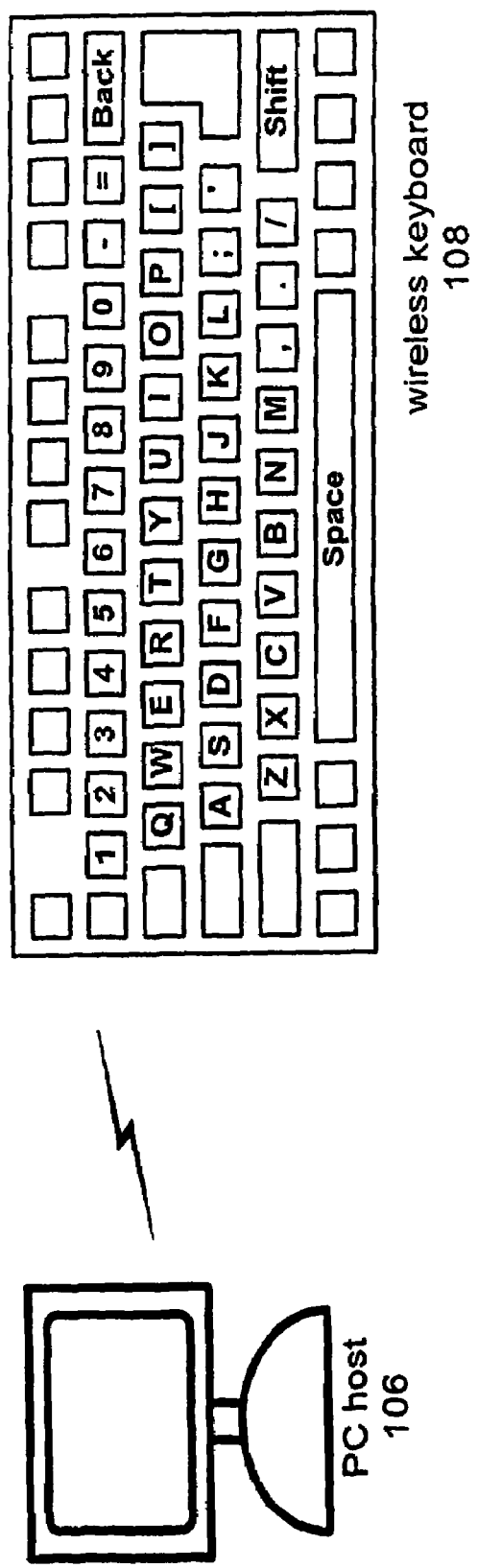
FIG. 1 is an exemplary system diagram illustrating a personal computer and an input device.

FIG. 1 is a system diagram illustrating a personal computer (PC) host 106 and an input device (e.g., keyboard 108) that may include a wireless or wired (or both) interface and detection means, according to one embodiment.

Figure 2:
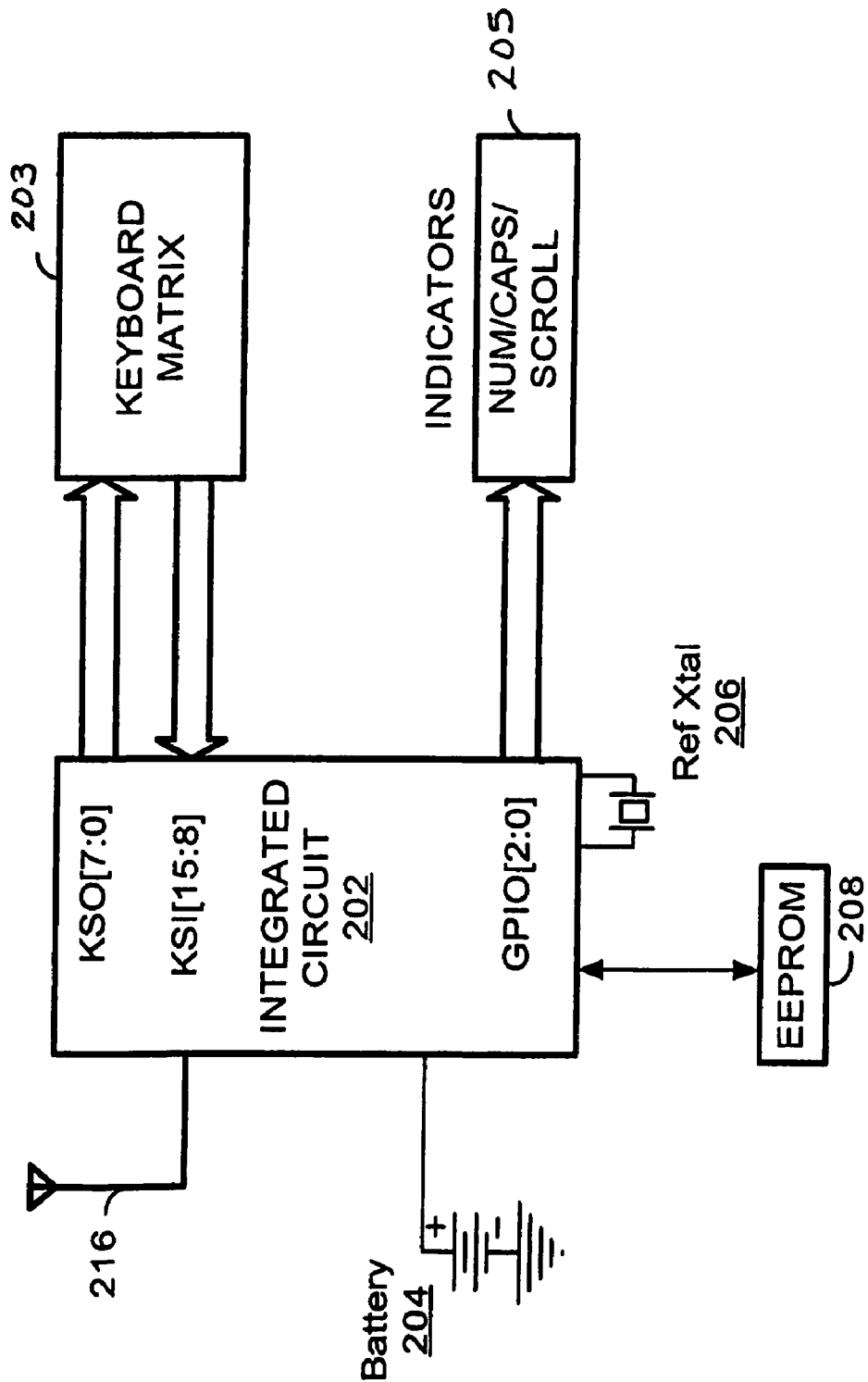
FIG. 2 is an exemplary schematic block diagram illustrating the structure of a keyboard matrix, according to one embodiment.

FIG. 2 is a schematic block diagram illustrating the structure of a keyboard matrix 203 that operates in conjunction with an interface device (e.g., an integrated circuit 202), according to one embodiment. As shown in FIG. 2, interface device 202 services a key scan matrix 203 that provides inputs from the keyboard. The interface device 202 couples to a crystal 206, an EEPROM 208, and an antenna 216. Indicators 205 include number, capitals, and scroll lights that are lit on the keyboard. Interface device 202 includes a processor that detects and controls the keys via the keyboard matrix 203.

Figure 3:
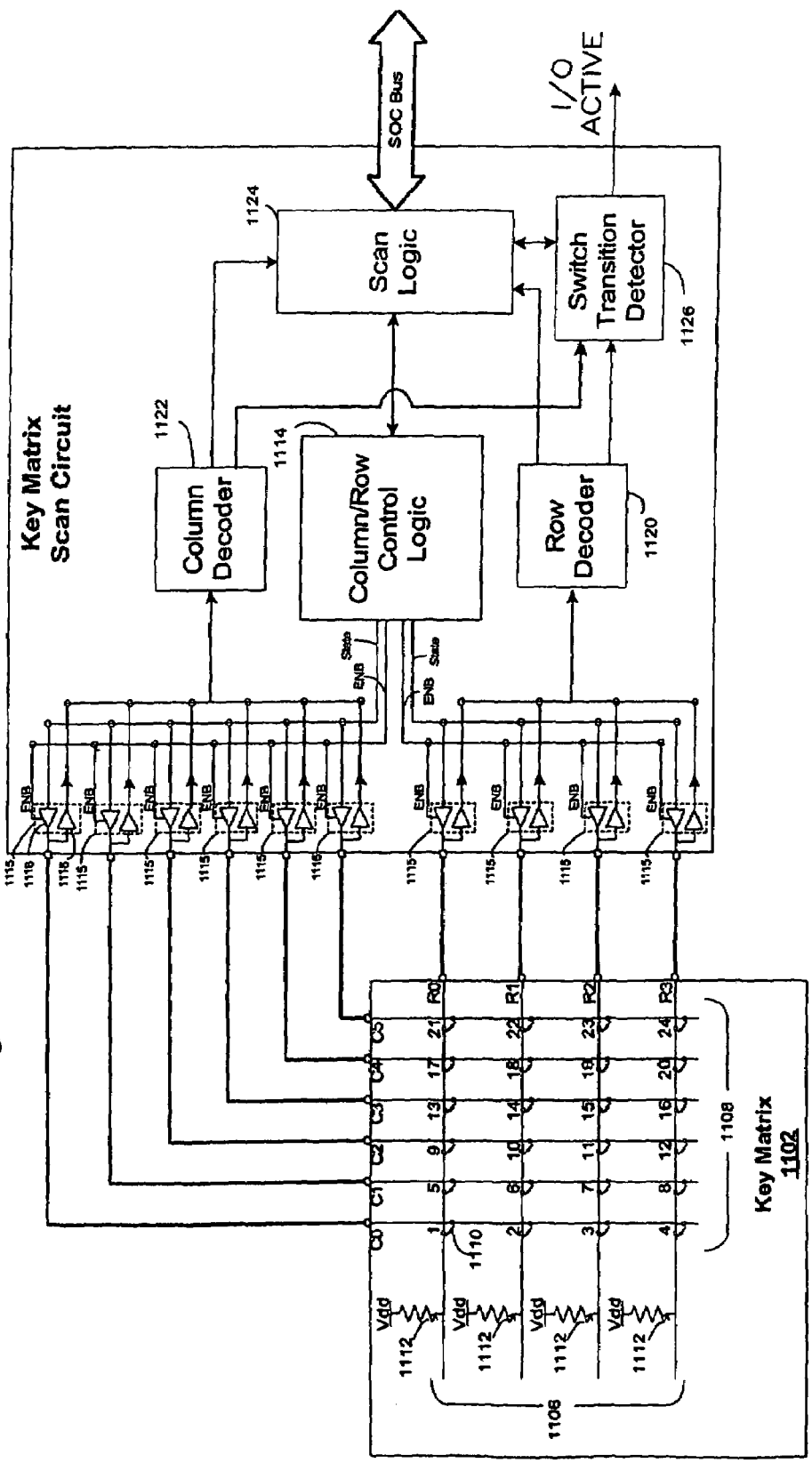
FIG. 3 is an exemplary illustration of a keyboard switch matrix connected to a key matrix scan circuit, according to one embodiment.

FIG. 3 is an illustration of a keyboard switch matrix 1102 connected to a key matrix scan circuit 302. The keyboard matrix 1102 comprises a plurality of columns 1108 and a plurality of rows 1106. In the exemplary embodiment shown in FIG. 3, the plurality of columns 1108 comprises six columns C0-C5 and the plurality of rows comprises four rows, R0-R3. For simplicity reasons, the embodiment illustrated in FIG. 3 shows only a small portion of an actual keyboard matrix. It is understood by those skilled in the art that the number of rows and columns can be increased or decreased depending on the specific application.

A plurality of switches 1110 connect the respective rows and columns when a corresponding key is pressed by a user. In this example, switch 1110 connects row R0 and column C0 when the switch 1110 is pressed. Although a reference numeral has not been provided for each of the switches, it should be understood that a total of 24 switches 1110 are associated with the intersection of the rows and columns in FIG. 3. For purposes of discussion, the twenty-four illustrative switches 1110 in FIG. 3 are referred to as Switch 1, Switch 2, . . . , Switch 24. When all of the respective switches in a particular row are open, the row is pulled "high" by resistor 1112 that is connected to Vdd. Rows R0-R3 provide inputs to row decoder 1120 in the key matrix scan circuit 302, as will be discussed in greater detail below.

Key matrix scan circuit 302 comprises column/row control logic 1114 and driver logic 1115 that generate appropriate signals to control the state of the respective columns and rows. Driver logic 1115 comprises a tri-state driver 1116 and a buffer 1118. The column/row control logic 1114 generates appropriate "high" and "low" signals that are provided to the inputs of the tri-state drivers 1116. The column/row control logic can change the state of a particular row or column by generating appropriate "enable" signals that control the operation of the tri-state drivers 1116 in the control logic 1115.

For example, if the input of the tri-state driver 1116 is "high," the generation of an enable signal causes the tri-state driver 1116 to apply the "high" signal at its output to drive the column or row "high." Conversely, if the input to the tri-state driver 1116 is "low," the generation of an enable signal causes that tri-state driver to drive the column or row "low." The enable signals can be global enable signals intended to enable the tri-state drivers for all rows, e.g. ENB_R, or for all columns, e.g. ENB_C. The enable signals also can be directed to a tri-state driver for a particular row, e.g. ENB_R1, or for a particular column, e.g. ENB_C3.

The key matrix scan circuit 302 also comprises row decoder 1120 and column decoder 1122 that are operable to decode output signals received from the respective rows and columns in the keyboard matrix 1102. The decoded output signals from the row decoder 1120 and the column decoder 1122 are provided to scan logic 1124 which generates a data stream indicating the state of various switches (keys) 1110.

The key matrix scan circuit 302 also comprises a switch transition detection circuit 1126 that receives output signals from the row decoder 1120 and the column decoder 1122. The switch transition detection circuit 1126 is communicatively coupled to the scan logic 1124 which scans the various rows and columns as described hereinbelow. In addition, the switch transition detection circuit 1126 generates an "I/O Active" signal that is provided to the input/output unit 306 (in FIG. 3) to cause the system to transition into the "busy" mode as described above. In one embodiment, the switch transition detection circuit 1126 includes a hardware switch debounce circuit for correcting mechanical bounces of the keys. The debounce circuit provides power/performance efficient design that is even more suitable for wireless input devices.

Figure 4:
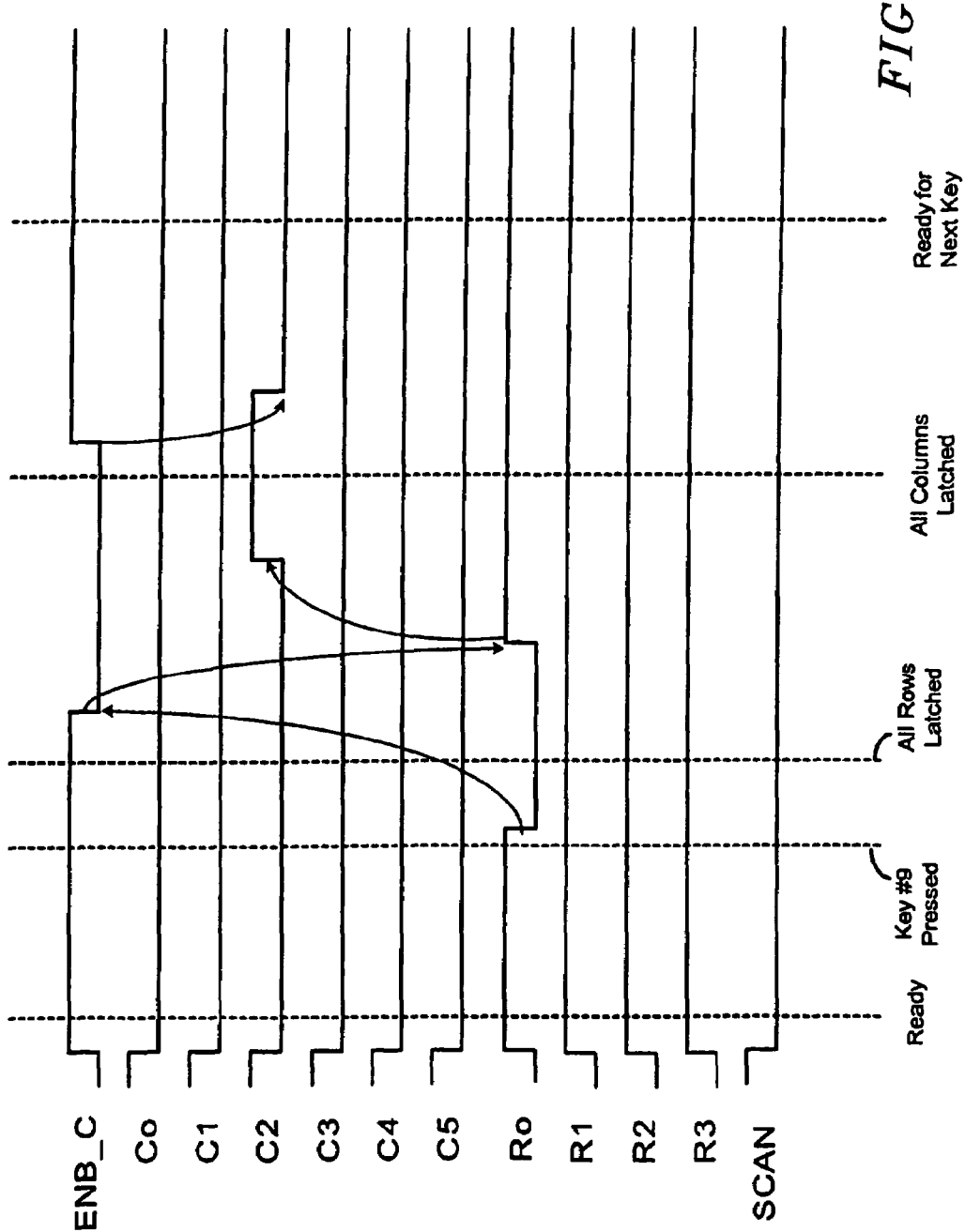
FIG. 4 is an exemplary timing diagram for a keyboard scan circuitry, according to one embodiment.

Operation of the keyboard scan circuitry can be understood by referring to the timing diagram of FIG. 4. Referring to FIG. 4, the initial state of all of the rows and columns is analyzed beginning at the "Ready" reference line. The transitions to the left of the "Ready" reference are provided simply to clarify the "high" or "low" status of the rows and columns when processing begins. Beginning at the "Ready" reference point, ENB_C is high (active) and all columns are driven low by the tri-state drivers 1116. All of the rows are pulled high via the resistors 1112 shown in FIG. 3.

If for example, Switch (Key) #9 is pressed, R0 transitions from "high" to "low." This transition is used as a trigger to latch (store) all row values. This transition also causes ENB_C to transition from "high" to "low." Since ENB_C is "low," the columns are no longer being driven and, therefore, R0 transitions back to "high." The actual transition of R0 to "high" will be delayed somewhat by the RC constant combination of the line capacitance of column C2 and the resistor 1112. Since switch #9 is still pressed, the column C2 transitions to "high." The "low" to "high" transition of column C2 is used as a trigger to latch all column values. After the column values have been latched, ENB_C transitions from "low" to "high" and column C2 transitions from "high" to "low." All other columns are also maintained in the "low" state since ENB_C is now high (active).

In the example shown in FIG. 4, there is one high latched column value (C2) and one low latched row value (R0). The single latched column and the single latched row uniquely identify a single key switch (switch #9) and therefore there is no need to enter into a "scan" of other rows and columns. Thus the scan signal remains "low" during the entire cycle. The column/row control logic 1114, in conjunction with the driver logic 1115, is operable to generate all of the control signals necessary to control the state transitions described above.

Furthermore, the switch transition detection circuit 1126 is operable to generate a "I/O Active" signal for an input/output unit (not shown) immediately upon receiving an output signal from the row decoder 1120 and/or the column decoder 1122 indicating that a switch has been activated. In this example, the "I/O Active" signal is generated immediately by the switch transition detection circuit 1126 immediately upon detection of the transition of row R0 from "high" to "low" as a result of switch #9 being activated.

Figure 5:
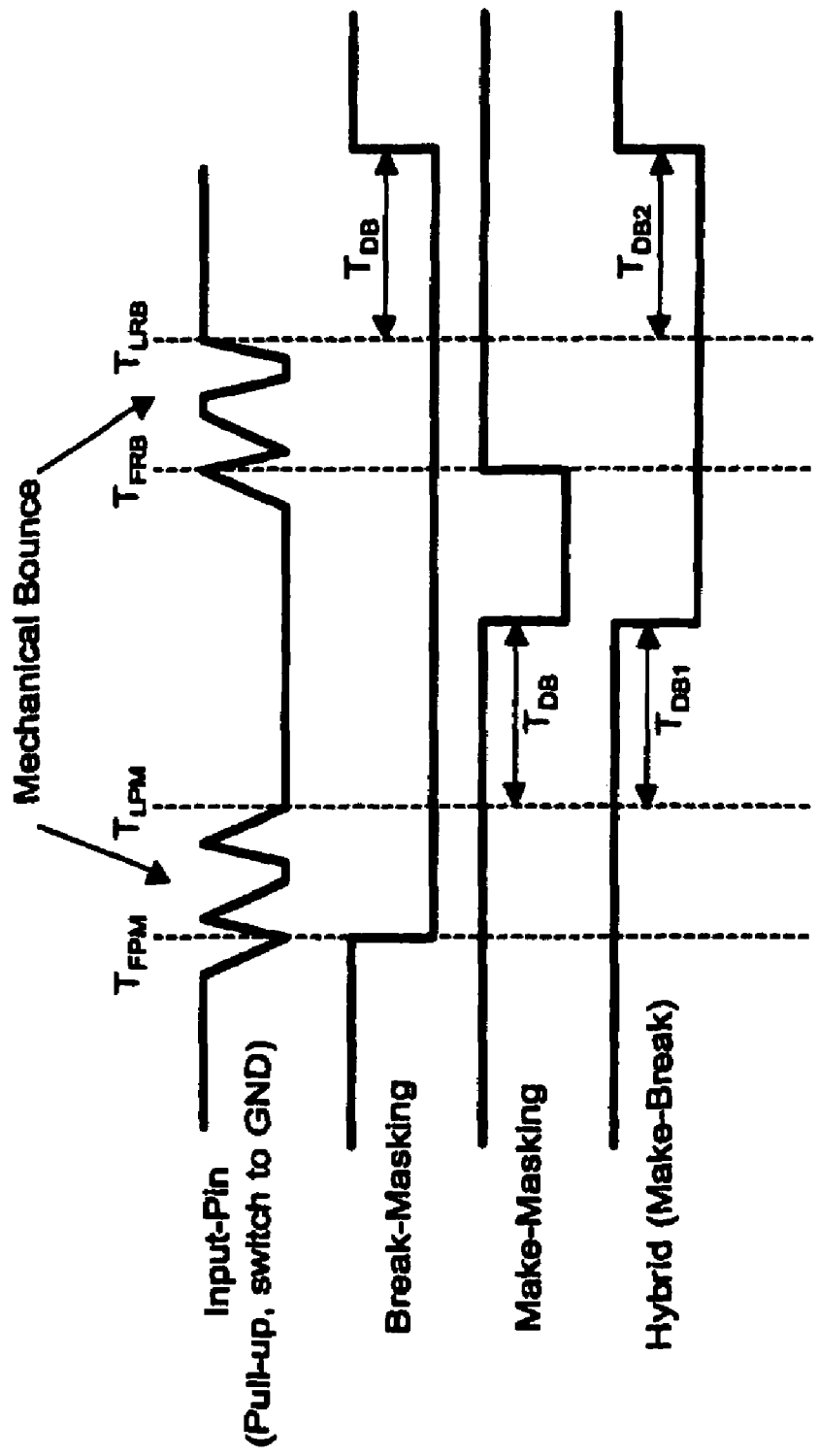
FIG. 5 is an exemplary timing diagram for a break-masking approach, a make-masking approach, and a hybrid approach, respectively.

In one embodiment, a hardware switch debounce circuit corrects mechanical bouncing of the keys. There are different approaches to implementing the debounce feature including, break-masking approach, make-masking approach, and a hybrid approach of the two. FIG. 5 depicts a timing diagram for the debounce methods, mentioned above.

The notations shown in FIG. 5 are defined as:
TDB=Debounce interval
TFPM=Time of first key-push make
TLPM=Time of last key-push make
TFRB=Time of first key-release break
TLRB=Time of last key-release break As shown, in the Break-Masking approach, if a key is pressed (i.e. a "make" is detected), it is immediately registered as a valid key press. If a mechanical bounce results in short periods during which the switch is open (i.e. a "break" condition), the debounce algorithm "masks" the breaks by continuing to report the switch as if it were still closed for a period equal to TDB. The timer (e.g., a counter) which measures TDB must then be reset whenever a make condition is present. This approach is analogous to resistor-capacitor methods common on the RESET lines of many microcontrollers, where TDB corresponds to the RC time constant.

In this approach, key closure is reported at the earliest possible time, and total reported key-closure time is (TLRB−TFPM)+TDB.

In the Make-Masking approach, if a key is pressed, it is not registered as a valid key press until a continuous make is detected for a period of >TDB. Hence, any make periods less than TDB in duration are masked. Upon key release, the first break results in the key being reported as released, and any further makes <TDB will be masked. In this approach, total reported key-closure time is (TFRB−TLPM)−TDB, and make periods of less than TDB are completely masked.

In the Hybrid approach, make-masking is used to detect the beginning of a key press. Once it is determined that the key is indeed down, a break-masking approach is used to determine if the key is released. A different TDB may be used for key-press detection than for key-release detection. In this approach, key closure is reported at the earliest possible time, total reported key-closure time is (TLRB+TDB2)−(TLPM+TDB1), and make periods of less than TDB1 are completely masked Typically, the Break-Masking approach simplifies the implementation of both debouncing and of de-ghosting. Since makes are reported immediately, it is not necessary to buffer key-presses, and then to later determine if the key is down for enough time. In addition, ghosting can be detected immediately at the end of each full scan of all rows and columns, whereas break-masking or the hybrid approaches require keys to be buffered and time-stamped such that they do not enter the ghost detection algorithm until they have been down for a sufficient amount of time.

A Register Transfer Language (RTL) description of components for break-masking approach is described below. Those skilled in the art will be able to easily understand and implement a RTL description for the make-masking and hybrid approaches.

Notation:
+ = Logical OR
* = Logical AND
SSM[1:0] = Scan State Machine
RTC[2:0] = Row terminal count-control register
CTC[4:0] = Column terminal count-control register
MKYVn[7:0] = Nth Modifier Key Value
S0 = Idle State
S1 = Scan State
S2 = De-Ghost State -continued S3 = Store-to-Buffer State
SEFF = Scan Enable Flip-Flop
KI = Key.Index Counter
1) 3-bit Row Counter (RC): to count 8 column inputs
   Sync Reset: ((SSM = S0) + (RC = RTC))
   Increment: (SSM = S1)
2) 5-bit Column Counter (CC): to count 19 row outputs
   Sync Reset: (SSM = S0)
   Increment: (RC = RTC)
3) 8-bit "Row Hit" register (RH): to record row-hits as columns are scanned
   For each Nth bit:
   Sync Reset: (SSM = S0)--Unnecessary, as each bit is set/cleared as column is scanned
   Load: (RC = <Nth bit>)
   Inputs: RH[N] + KSI[N]
4) 8-bit "Single-Hit" register (SH): to record hits in columns with only 1 key down
   For each Nth bit:
   Sync Reset: (SSM = S0)
   Load: (RC = 0)--note 1 cycle pipe-lining--SH takes RH one cycle later
   Inputs: SH[N] + RH[N]
5) 8-bit "Multi-Hit" register (MH): to record hits in columns with 2 or more keys down
   For each Nth bit:
   Sync Reset: (SSM = S0)
   Load: (RC = 0)--note 1 cycle pipe-lining--MH takes RH one cycle later
   Inputs: MH[N] + RH[N]
6) 8-bit key-index counter (KI): incremented at each key-scan, for usage code lookup
   Sync Reset: (SSM = S0)
   Increment: (SSM = S1)
7) Scanning State Machine (SSM):
   Async Reset: POR
   Input (next state):
   S0 if SEFF = 0 + (SSM = S3 * RH! = 0)
   S1 If SSM = S0*SEFF = 1
   S2 if SSM = S1*(CC = CTC)*(RC = RTC)
   S3 if SSM = S2
   6-byte buffer
   For each single-byte key buffer, KB[N]:
   Sync Reset: (SSM = S0) (Reset to all 1's)
   Load: (NewKey! = KB[N] * NewKey ! = MDKY[N])
   for all N
   (Store NewKey to beginning of buffer if not already in buffer)
   Inputs: KB[N-1] for KB[N] where N>0; NewKey value for KB[0]
   For each debounce count value, DBCV[N]:
   Load: (NewKey! = KB[N] * NewKey ! = MDKY[N])
   for all N OR
8) Scan-clock enable flip-flop--1-bit to enable low-power oscillator
   Async Set: Logical OR of pulse detects on each Wake signal from each peripheral
   Async Reset: POR+(AND of all .about.BUSY signals from peripherals)
   Sync Reset:
9) KSO: Key scan outputs
   KSI[N] = 1 if SSM = S0+
   KSI__OE[N] = SSM = S0 * N! = RC In one embodiment, a hardware implementation of a variation of the hybrid approach is utilized for a micro-debounce key detection. That is, key down (down for predefined number of clock cycles) and up events (up for predefined number of cycles) are both checked by the micro debounce method. Once a key press is detected with the micro-debounce operation, a macro-debounce operation is performed on the key to determine whether the key should be recognized as an activated key.

Therefore, the key debounce operation is divided into two steps: a micro-debounce operation and a macro-debounce operation. The micro-debounce key detection is a preliminary hardware-based filtering for the key press (e.g., down) event that is based on the hardware system clock. This is to filter out short term event(s) that can occur such as in an electrical fast transient (EFT) events. Once a key press is detected, the key press is tested again in the next few clock cycles based on the value defined in a u_debounce[1:0] register.

Figure 6A:
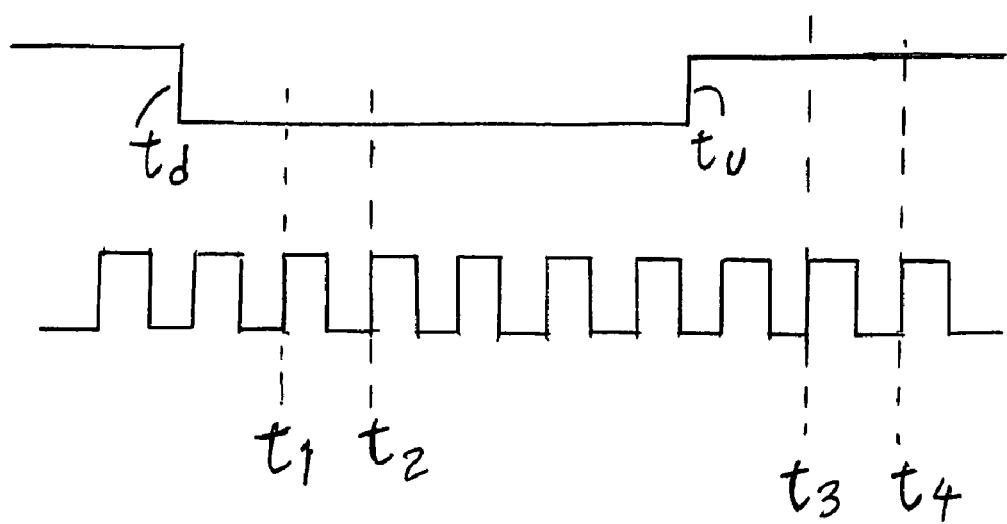
FIG. 6A is an exemplary timing diagram for a micro-debounce operation, according to one embodiment.

FIG. 6A depicts an exemplary timing diagram for the micro-debounce step. As shown, when an exemplary key A is pressed down at time td, a key activation is detected after one system clock (SCK) cycle, that is at time t.sub.1, if the u_debounce register is programmed with a value of 1. Similarly, a key activation is detected after two system clock cycles (t.sub.2), if the u_debounce register is programmed with a value of 2. Likewise, when key A is released at time t.sub.u, a key activation is detected after one (full) system clock cycle, that is at time t.sub.3, if the u_debounce register is programmed with a value of 1. Alternatively, if the u_debounce register is programmed with a value of 2, a key release is detected after two system clock cycles, at time t.sub.4. In one embodiment, two u_debounce registers may be used to include different values for the key press and key release micro-debounce operation, depending on the system requirements.

In one embodiment, the u_debounce register is defined as:
u_debounce[1:0]=0->check key down (& up) for 1 cycle.
u_debounce[1:0]=1->check key down (& up) for 2 cycle.
u_debounce[1:0]=2->check key down (& up) for 3 cycle.
u_debounce[1:0]=3->check key down (& up) for 4 cycle.

Once this micro-debounce criterion is met, the key status is moved into a key debounce buffer for the hardware-based macro-debounce operation. The macro-debounce operation checks that the key is meeting debounce requirement in multiple (user definable) hardware key scan cycles. Therefore, the macro-debounce operation is based on the hardware key scan cycle, which is, in turn, based on the system clock.

In one embodiment, the hardware key scan cycle is defined as:
Time for scanning all (e.g., 8×20) keys+Time duration of the scancycle_timer[11:0]+(# of key pressed * u_debounce+ 1)/SCK For a high performance keyboard that requires fast key detection, the scancycle_timer can be set to zero. This results in a debounce interval defined by the following:
u_debounce * total # of keys/128K Only the key that is detected "down" is further subjected to the u_debounce times of testing. Thus, the hardware key scan cycle will be longer if the key is pressed in that cycle. For example, for a 8×20 matrix, u_debounce=2 and scancycle_timer=0, the hardware debounce interval is (8*20+3)/SCK=1.27 ms, based on the above equation for a SCK frequency of 128 KHz.

In some case, depending on the mechanical bounce characteristics of the key switch, a single key down event can be mistaken as multiple key press events. The scan cycle timer (scancycle_timer) is be used to space the hardware scan activity, so that the above false scenario will be less likely to occur. In operation, the scan cycle timer may be programmed to add an additional (user programmable) delay to each of the hardware key scan cycle to more effectively detect a key down event.

Figure 6B:
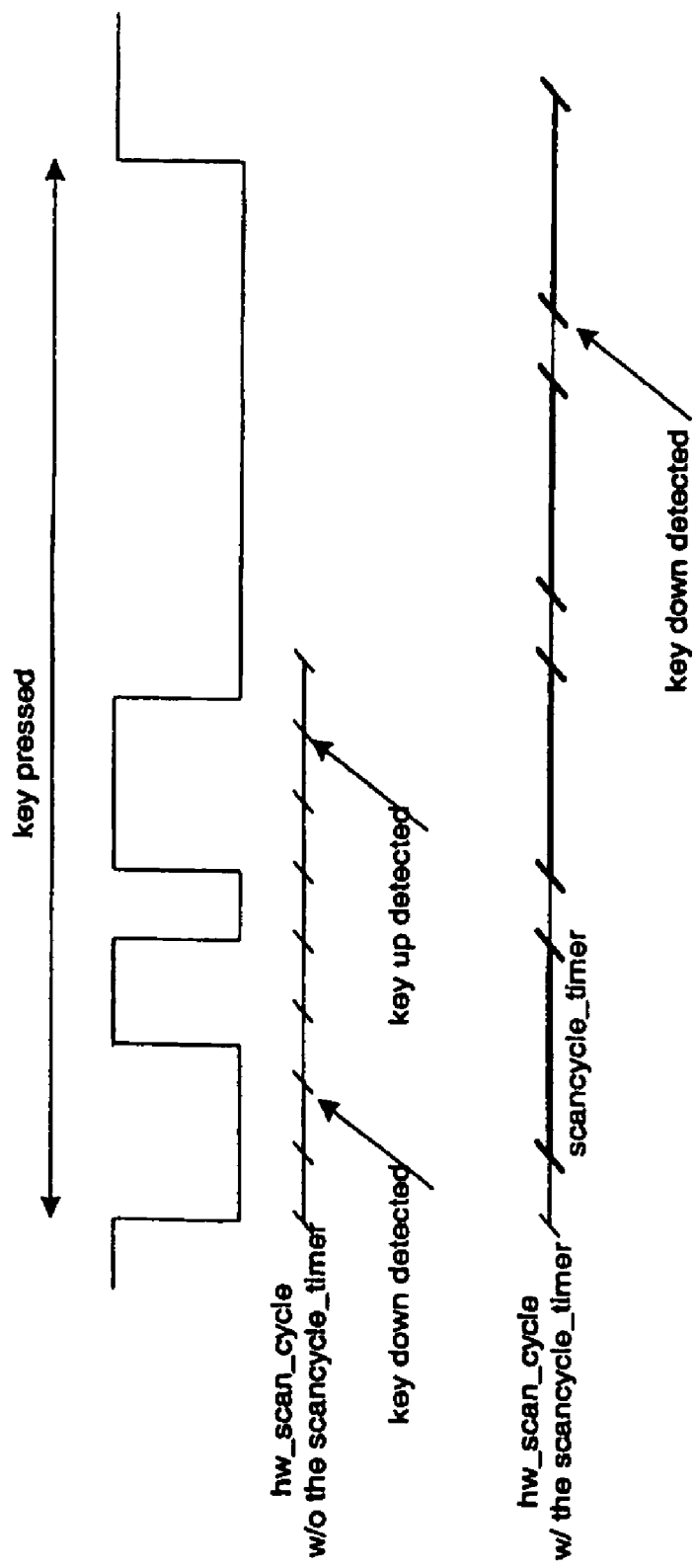
FIG. 6B is an exemplary timing diagram illustrating a macro-debounce key detect, according to an embodiment.

FIG. 6B is an exemplary timing diagram illustrating a macro-debounce key detect scenario with and without the scancycle_timer. As shown, in the case of scancycle_timer=0, a macro-debounce key down is detected after three hardware key scan cycles (maD_debounce=3). A macro-debounce key up (release) is detected also after three hardware key scan cycles (mau_debounce=3). The values for maD_debounce and maU_debounce may be different. In the case of scancycle_timer=.DELTA.t, a delay of At is added at the end of each of hardware key scan cycle.

FIG. 7 shows an exemplary debounce buffer, according to one embodiment. A key status that had satisfied the micro-debounce down criteria is stored in a (e.g., 13×10) debounce buffer for further checking for macro-debounce. As shown, each entry of the debounce buffer includes an 8-bit key index store, a 4-bit up/down (UP/DN CNTR) macro-debounce counter (macro_debounce_cntr) and a bit (UP/DN) to indicate whether up or down debounce is being performed on the key stored in a particular key index field.

In one embodiment, each entry of debounce buffer is defined as:
bit 12: "0" key in down detection; "1" key in up detection;
bit 11-8: key macro-debounce counter; an up/down counter;
bit 7-0: key index.

The u-debounce buffer preferably needs to be checked for debounce conditions during each key matrix scan, regardless whether a key is pressed or not.

FIG. 8 illustrates an exemplary key event buffer, according to one embodiment. As shown, there are two entries for the key index "A" in this embodiment. When the macro-debounce key down event for key "A" is detected, the key index is stored in the key event buffer with a 0 for the UP/DN field. Key "A" is then checked for transitioning high, that is, a key release detection. After the micro-debounce detection is satisfied for the key release, a micro-debounce detection is perform to detect a key release for Key "A". Once the macro-debounce detection for the key release is satisfied, the key index is again stored in the key event buffer with a 1 for the UP/DN field.

In one embodiment, when a key doesn't pass the macro-debounce criteria in a side-by-side hardware scan cycle, the macro-debounce counter is reset to "zero". For example, if the maD_debounce[3:0]=3 and a key is detected as down, down, up, down, down, down, then the maD_debounce counter contains the values: 1, 2, 0, 1, 2, 3. At count 3, the key is copied to the key event buffer.

In one embodiment, each entry of the key event buffer is defined as:
bit 8: set to 0 for the key down indication; 1 for key up
[0121] bit 7-0: key index The following examples illustrate how a key debounce operate. When a key is pressed down, a micro-debounce operation is performed. After being qualified by the micro-debounce operation, a key is tested for the macro-debounce criteria defined by the key down macro-debounce register (maD_debounce[3:0]). If a key is detected for the "maD_debounce" number of consecutive hardware scan cycle, it is then moved to the (e.g., 12×9) key event buffer for input device firmware (running, for example, in the processor included in the interface device 202 of FIG. 2) to access. Also, a hardware interrupt to the firmware can be generated if enabled.

In a key up micro-debounce operation, once a key has been detected as down, bit 12 of the debounce buffer is set to indicate that the key in the debounce buffer is ready for macro-debounce key up detection. This bit also switches the debounce counter (shown in FIG. 7) to a down counting mode. In one embodiment, the u_debounce value is used for the detection of key up event also. The debounce counter counts down by one, whenever a debounce buffer key is up for the "u_debounce" consecutive cycles. In one embodiment, a different user definable value for u_debounce is used for the detection of key up event.

In a key up macro-debounce operation, the key has to be up for the "maU_debounce" consecutive hardware scan cycles to be considered released. The released key is copied into the key event buffer with bit 8 set to "1" to indicate an up event.

In one embodiment, the system includes the following user-programmable registers that are used in the micro-debounce operation and the macro-debounce operation.

u_debounce[1:0]
maD_debounce[3:0]
maU_debounce[3:0]
scancycle_timer[11:0]

In one embodiment, the key event buffer is mapped into the memory space.

It will be recognized by those skilled in the art that various modifications may be made to the illustrated and other embodiments described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method comprising:
   detecting a key activation of a user operated input device;
   testing the key activation for a predetermined number of clock cycles;
   storing a key index identifying the activated key in a buffer when the key activation is valid for the predetermined number of clock cycles;
   testing the identified activated key for a predetermined number of hardware key scan cycles; and
   establishing a key activation event when the key activation is valid for the predetermined number of hardware key scan cycles.

2. The method of claim 1, further comprising:
   detecting a key release;
   testing the key release for a predetermined number of clock cycles;
   testing the key release for a predetermined number of hardware key scan cycles, if the key activation is valid for the predetermined number of clock cycles; and
   establishing a key release event, if the key release is valid for the predetermined number of hardware key scan cycles.

3. The method of claim 2, wherein the predetermined number of hardware key scan cycles for testing the key activation is the same as the predetermined number of hardware key scan cycles for the key release.

4. The method of claim 1, further comprising adding a predetermined time delay to each of the hardware key scan cycles.

5. The method of claim 1, wherein the clock cycles are related to system clock cycles.

6. The method of claim 1, wherein the key activation is a key activation selected from the group consisting of a pressed down key on a keyboard, a movement of a mouse, a movement of a joystick, and a sensed event.

7. The method of claim 1, wherein the predetermined number of hardware key scan cycles for testing the key activation is different from the predetermined number of hardware key scan cycles for the key release.

8. The method of claim 1, wherein the user operated input device is a wireless device.

9. A system for detecting a key with key debounce comprising:
   a circuit configured to detect a key activation;
   a first counter coupled to the circuit and a clock configured to test the key activation for a first predetermined number of clock cycles;
   a key debounce buffer configured to store a key index identifying the activated key when the key activation is valid for the first predetermined number of clock cycles;
   a second counter configured to test the identified activated key for a first predetermined number of hardware key scan cycles; and
   a key event buffer configured to store a key activation event when the key activation is valid for the first predetermined number of hardware key scan cycles.

10. The system of claim 9, wherein the circuit is configured to detect a key release, the first counter is configured to test the key release for a second predetermined number of clock cycles, the second counter is configured to test the key release for a second predetermined number of hardware key scan cycles when the key activation is valid for the second predetermined number of clock cycles, and the key event buffer is configured to store a key release event when the key release is valid for the second predetermined number of hardware key scan cycles.

11. The system of claim 10, wherein the first predetermined number of clock cycles is the same as the second predetermined number clock cycles and the first predetermined number of hardware key scan cycles is the same as the second predetermined number of hardware key scan cycles.

12. The system of claim 10, wherein the first predetermined number of hardware key scan cycles is different from the second predetermined number of hardware key scan cycles.

13. The system of claim 9, wherein the clock cycles are related to system clock cycles.

14. The system of claim 9, wherein the key activation is a key activation selected from the group consisting of a pressed down key on a keyboard, a movement of a mouse, a movement of a joystick, and a sensed event.

15. The system of claim 9, wherein the first counter is an up/down counter.

16. The system of claim 9, wherein the second counter is an up/down counter.

17. A system comprising:
   a wireless keyboard for receiving input from a user;
   a first counter coupled to the circuit and a clock configured to test an activation of a key in the keyboard for a predetermined number of clock cycles;
   a key debounce buffer configured to store a key index identifying the activated key when the key activation is valid for the first predetermined number of clock cycles;
   a second counter configured to test the tested activated key for a predetermined number of hardware key scan cycles when the activation of the key is valid for the predetermined number of clock cycles;
   a key event buffer configured to store a key activation event when the key activation is valid for the first predetermined number of hardware key scan cycles; and
   an antenna configured to transmit a signal to a host indicating a key activation when the key activation is valid for the first predetermined number of hardware key scan cycles.

18. The system of claim 17, further comprising:
   a circuit configured to detecting a release of the key;
   a circuit configured to test the release of the key for a predetermined number of clock cycles;

a circuit configured to test the release of the key for a predetermined number of hardware key scan cycles when the key activation is valid for the predetermined number of clock cycles; and a circuit configured to establish a key release event when the release of the key is valid for the predetermined number of hardware key scan cycles.

19. The system of claim 17, further comprising a circuit configured to add a predetermined time delay to each of the hardware key scan cycles.

20. The system of claim 17, wherein the clock cycles are related to system clock cycles.

* * * * *